United States Patent
Kong et al.

(10) Patent No.: US 8,278,401 B2
(45) Date of Patent: Oct. 2, 2012

(54) RADIATION OR THERMALLY CURABLE BARRIER SEALANTS

(75) Inventors: Shengqian Kong, Edison, NJ (US); Sarah E. Grieshaber, Manville, NJ (US)

(73) Assignee: Henkel AG & Co. KGaA, Duesseldorf (DE)

( * ) Notice: Subject to any disclaimer, the term of this patent is extended or adjusted under 35 U.S.C. 154(b) by 289 days.

(21) Appl. No.: 12/280,119

(22) PCT Filed: Mar. 29, 2006

(86) PCT No.: PCT/US2006/011441
§ 371 (c)(1),
(2), (4) Date: Aug. 20, 2008

(87) PCT Pub. No.: WO2007/111606
PCT Pub. Date: Oct. 4, 2007

(65) Prior Publication Data
US 2010/0164368 A1    Jul. 1, 2010

(51) Int. Cl.
| | |
|---|---|
| *C08K 3/22* | (2006.01) |
| *C08K 3/36* | (2006.01) |
| *C08L 63/00* | (2006.01) |
| *C08L 63/02* | (2006.01) |
| *C08L 63/04* | (2006.01) |
| *H01L 23/29* | (2006.01) |

(52) U.S. Cl. ........ 525/524; 257/789; 257/793; 523/427; 523/451; 523/456; 523/458; 523/466; 523/468; 525/121; 525/481; 525/523; 525/527; 525/529; 525/530; 525/531

(58) Field of Classification Search .................... None
See application file for complete search history.

(56) References Cited

U.S. PATENT DOCUMENTS

| | | | |
|---|---|---|---|
| 3,925,315 A | * | 12/1975 | Schmid ................ 528/87 |
| 7,687,119 B2 | | 3/2010 | Cao et al. |
| 7,887,716 B2 | | 2/2011 | Kong et al. |
| 7,902,305 B2 | | 3/2011 | Kong |
| 2005/0189834 A1 | | 9/2005 | Ikeda et al. |
| 2006/0223937 A1 | * | 10/2006 | Herr et al. ............ 524/556 |
| 2006/0223978 A1 | * | 10/2006 | Kong .................. 528/417 |

FOREIGN PATENT DOCUMENTS

| | | | |
|---|---|---|---|
| EP | 1138739 A1 | | 10/2001 |
| EP | 1657268 A1 | | 5/2006 |
| EP | 1674919 A1 | | 6/2006 |
| GB | 991452 A | * | 5/1965 |
| JP | 62-127315 A | * | 6/1987 |
| JP | 9052942 A | | 2/1997 |
| JP | 2001100224 A | | 4/2001 |
| JP | 2005-120141 A | * | 5/2005 |
| WO | WO 03-76544 A1 | * | 9/2003 |

* cited by examiner

*Primary Examiner* — Robert Sellers
(74) *Attorney, Agent, or Firm* — Jane E. Gennaro

(57) ABSTRACT

This invention relates to curable sealants that provide low moisture permeability and good adhesive strength after cure. The composition comprises an aromatic compound having meta-substituted reactive groups and a cationic or radical initiator.

10 Claims, 1 Drawing Sheet

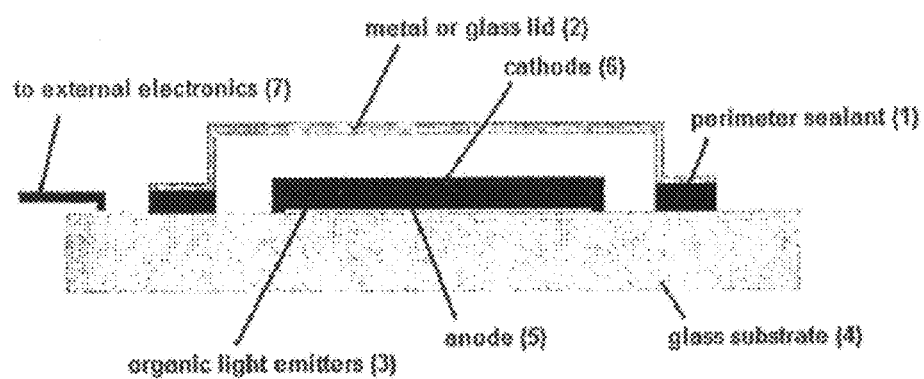

RADIATION OR THERMALLY CURABLE BARRIER SEALANTS

This invention was made with support from the Government of the United States of America under Agreement No. MDA972-93-2-0014 awarded by the Army Research Laboratories. The Government has certain rights in the Invention.

RELATED APPLICATIONS

This application is related to U.S. patent applications with Ser. No. 11/098,115, abandoned; Ser. No. 11/098,116, abandoned; and Ser. No. 11/098,117, granted as U.S. Pat. No. 7,687,119.

FIELD OF THE INVENTION

This invention relates to barrier sealants, adhesives, encapsulants, and coatings for use in electronic and optoelectronic devices. (As used in this specification and claims, adhesives, sealants, encapsulants, and coatings are similar materials, all having adhesive, sealant, and coating properties and functions. When any one is recited, the others are deemed to be included.)

BACKGROUND

Radiation curable materials have found increased use as coatings, adhesives, and sealants over the past three decades for reasons including low energy consumption during cure, rapid cure speed through either radical or cationic mechanisms, low curing temperature, wide availability of curable materials, and the availability of solvent-free products. These benefits have made such products especially suited for rapidly adhering and sealing electronic and optoelectronic devices that are temperature sensitive or cannot conveniently withstand prolonged curing times. Optoelectronic devices particularly are often thermally sensitive and may need to be optically aligned and spatially immobilized through curing in a very short time period.

Numerous optoelectronic devices are also moisture or oxygen sensitive and need to be protected from exposure during their functional lifetime. A common approach is to seal the device between an impermeable substrate on which it is positioned and an impermeable glass or metal lid, and seal or adhere the perimeter of the lid to the bottom substrate using a radiation curable adhesive or sealant.

A common manifestation of this package geometry is exemplified in FIG. 1, which discloses the use of a radiation curable perimeter sealant (1) to bond a metal or glass lid (2) over an organic light emitting diode (OLED) stack (3) fabricated on a glass substrate (4). Although various configurations exist, a typical device also contains an anode (5), a cathode (6), and some form of electrical interconnect between the OLED pixel/device and external circuitry (7). For the purposes of this invention, no particular device geometry is specified or required aside from one which incorporates an adhesive/sealant material such as a perimeter sealant (1).

In many configurations, as for the example in FIG. 1, both the glass substrate and the metal/glass lid are essentially impermeable to oxygen and moisture, and the sealant is the only material that surrounds the device with any appreciable permeability. For electronic and optoelectronic devices, moisture permeability is very often more critical than oxygen permeability; consequently, the oxygen barrier requirements are much less stringent, and it is the moisture barrier properties of the perimeter sealant that are critical to successful performance of the device.

Good barrier sealants will exhibit low bulk moisture permeability, good adhesion, and strong interfacial adhesive/substrate interactions. If the quality of the substrate to sealant interface is poor, the interface may function as a weak boundary, which allows rapid moisture ingress into the device regardless of the bulk moisture permeability of the sealant. If the interface is at least as continuous as the bulk sealant, then the permeation of moisture typically will be dominated by the bulk moisture permeability of the sealant itself.

It is important to note that one must examine moisture permeability (P) as the measure of effective barrier properties and not merely water vapor transmission rate (WVTR), as the latter is not normalized to a defined path thickness or path length for permeation. Generally, permeability can be defined as WVTR multiplied by unit permeation path length, and is, thus, the preferred way to evaluate whether a sealant is inherently a good barrier material.

The most common ways to express permeability are the permeability coefficient (e.g. $g \cdot mil/(100 \, in^2 \cdot day \cdot atm)$), which applies to any set of experimental conditions, or the permeation coefficient (e.g. $g \cdot mil/(100 \, in^2 \cdot day)$ at a given temperature and relative humidity), which must be quoted with the experimental conditions in order to define the partial pressure/concentration of permeant present in the barrier material. In general, the penetration of a permeant through some barrier material (permeability, P) can be described as the product of a diffusion term (D) and a solubility term (S):

$$P=DS$$

The solubility term reflects the affinity of the barrier for the permeant, and, in relation to water vapor, a low S term is obtained from hydrophobic materials. The diffusion term is a measure of the mobility of a permeant in the barrier matrix and is directly related to material properties of the barrier, such as free volume and molecular mobility. Often, a low D term is obtained from highly crosslinked or crystalline materials (in contrast to less crosslinked or amorphous analogs). Permeability will increase drastically as molecular motion increases (for example as temperature is increased, and particularly when the $T_g$ of a polymer is exceeded).

Logical chemical approaches to producing improved barriers must consider these two fundamental factors (D and S) affecting the permeability of water vapor and oxygen. Superimposed on such chemical factors are physical variables: long permeation pathways and flawless adhesive bondlines (good wetting of the adhesive onto the substrate), which improve barrier performance and should be applied whenever possible. The ideal barrier sealant will exhibit low D and S terms while providing excellent adhesion to all device substrates.

It is not sufficient to have only a low solubility (S) term or only a low diffusivity (D) term in order to obtain high performance barrier materials. A classic example can be found in common siloxane elastomers. Such materials are extremely hydrophobic (low solubility term, S), yet they are quite poor barriers due to their high molecular mobility due to unhindered rotation about the Si—O bonds (which produces a high diffusivity term (O). Thus, many systems that are merely hydrophobic are not good barrier materials despite the fact that they exhibit low moisture solubility. Low moisture solubility must be combined with low molecular mobility and, thus, low permeant mobility or diffusivity.

For liquid materials that are cured to solid sealants, such as the inventive compositions, the attainment of lower molecular mobility within the cured matrix is approached through high crosslink density, microcrystallinity, or close packing of molecular backbones between the crosslinked portions of the matrix.

BRIEF DESCRIPTION OF THE DRAWING

FIG. 1 is a perimeter sealed optoelectronic device.

SUMMARY OF THE INVENTION

The inventors have discovered that certain resin and resin/filler systems provide superior barrier performance, particularly to moisture, through the incorporation of an initiator and an aromatic compound with meta-substituted reactive (functional) groups with the general structure

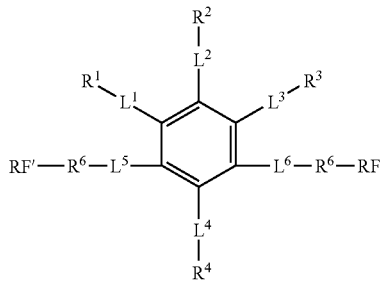

in which all R, L and RF groups are selected independently of each other for the purposes of this specification and the claims, and $R^1$, $R^2$, $R^3$, $R^4$ are selected from the group consisting hydrogen, halogen, cyano, alkyl, aryl, and substituted alkyl or aryl groups; $R^5$, $R^6$ are divalent hydrocarbon linkers having the general structure —$C_nH_{2n}$—, where n=0-4 (it will be understood that when n is 0, $R^5$, $R^6$ are not present), in which any two of $R^1$, $R^2$, $R^3$, $R^4$, $R^5$ and $R^6$ may form part of the same cyclic structure;

$L^1$, $L^2$, $L^3$, $L^4$, $L^5$, $L^6$ are either a direct bond or a divalent linking group selected from the group consisting of

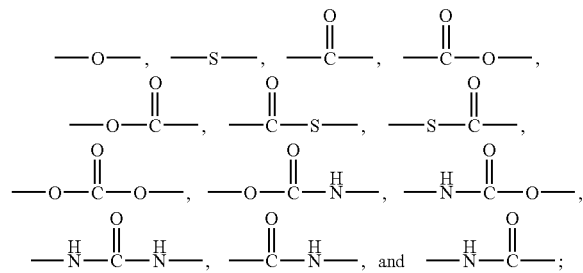

RF and RF' are curable functionalities selected from the group consisting of aliphatic epoxy, glycidyl ether, cycloaliphatic epoxy, hydroxyl (—OH), vinyl ether, propenyl ether, crotyl ether, styrenic, acrylate, methacrylate, itaconate, maleimide, maleate, fumarate, cinnamate, acrylamide, methacrylamide, chalcone, thiol, allyl, alkenyl, and cycloalkenyl groups. In one embodiment, RF and RF' are both epoxy functionalities. In another embodiment, RF and RF' are both acrylate functionalities. In a further embodiment, the RF functionality is an epoxy group and the RF' functionality is selected from the group consisting of hydroxyl, vinyl ether, propenyl ether, crotyl ether, styrenic; acrylate, methacrylate, itaconate, maleimide, maleate, fumarate, cinnamate, acrylamide, methacrylamide, chalcone, thiol, allyl, alkenyl, and cycloalkenyl groups.

As used in this specification and claims, the words epoxy, epoxide, and oxirane (and their plurals) refer to the same compound or types of compounds. Representative examples of the epoxy functionalities include, but are not limited to:

aliphatic epoxy glycidyl ether cycloaliphatic epoxy

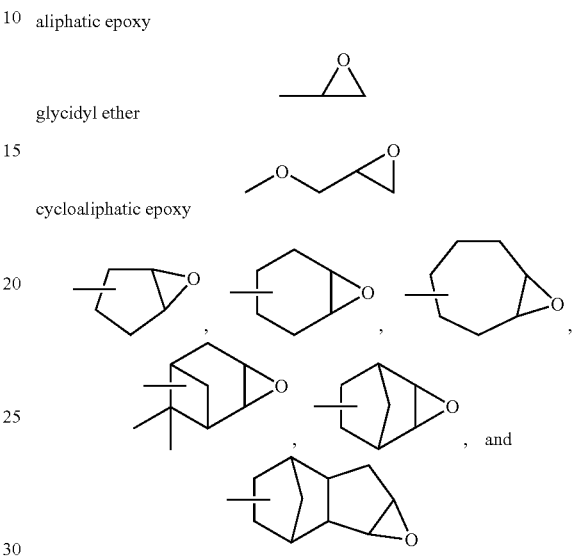

in which the hydrogens on the structures may be substituted by one or more alkyl or halogen groups. Representative examples of the styrenic groups include —Ph-CH═$CH_2$, —Ph-CMe═$CH_2$, where Ph means a phenyl group.

The curing initiators for these compounds will be either cationic initiators or radical initiators, depending on the RF and RF' groups. The choice of such initiators is within the expertise of one skilled in the art. In some embodiments, both cationic and radical initiators may be used.

Such barrier materials may be used alone or in combination with other curable resins and various fillers. The resulting compositions exhibit a commercially acceptable cure rate, a balance of high crosslink density and molecular packing (low permeant mobility/diffusivity term, D), hydrophobicity (low water solubility term, S), and adhesion (strong adhesive/substrate interfaces) to make them effective for use in sealing and encapsulating electronic, optoelectronic, electrophoretic, and MEMS devices.

DETAILED DESCRIPTION OF THE INVENTION

This invention is a curable barrier sealant comprising (a) an aromatic compound having meta-substituted reactive groups and (b) a cationic or radical Initiator, or both. The barrier adhesive or sealant optionally contains (c) one or more fillers and optionally, (d) one or more adhesion promoters. To satisfy various performance requirements, one or more additional epoxy resins may be used in a cationic or cationic/radical hybrid system, and these resins are preferably selected from the group consisting of bisphenol F diglycidyl ether, novolac glycidyl ethers, polycyclic epoxies, and halogenated glycidyl ethers. The use of a cationic or radical photoinitiator results in a radiation-curable formulation; the use of a cationic and/or radical system that can trigger polymerization at room or elevated temperatures results in a thermal cure formulation. The resulting compositions are suitable for use in sealing and encapsulating electronic and optoelectronic devices. Exemplary barrier sealant compounds are disclosed in the examples; others include, but are not limited to, the following:

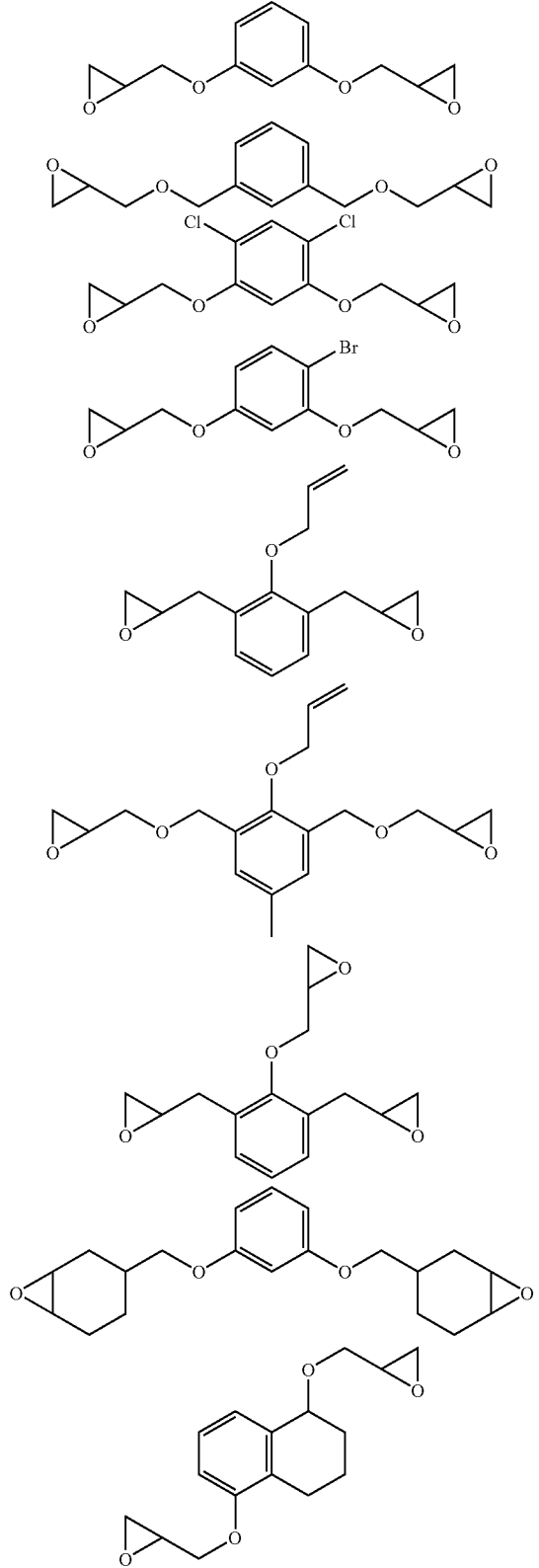

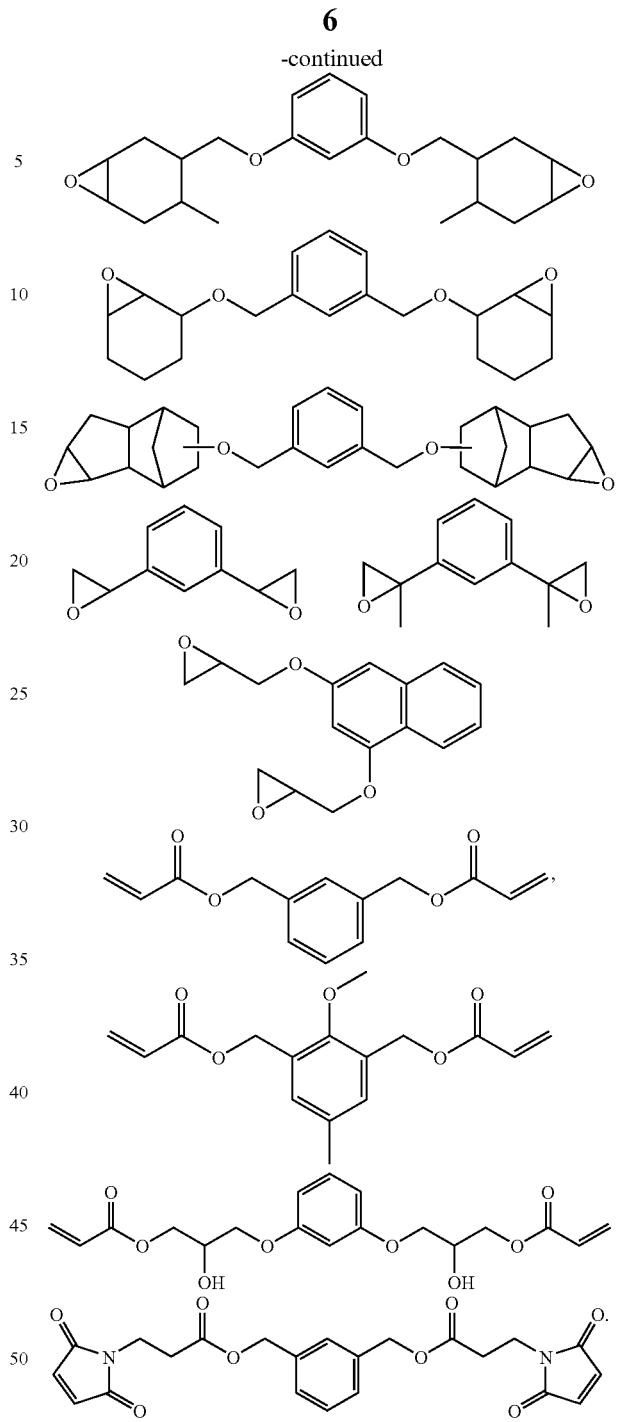

Within this specification, the term radiation is used to describe actinic electromagnetic radiation. Actinic radiation is defined as electromagnetic radiation that induces a chemical change in a material, and for purposes within this specification will also include electron-beam curing. In most cases electromagnetic radiation with wavelengths in the ultraviolet (UV) and/or visible regions of the spectrum are most useful.

The selection of an initiator for the inventive radiation curable barrier materials is familiar to those skilled in the art of radiation curing. For photocuring, the curing initiator will be a photoinitiator. The selection of an appropriate photoinitiator is highly dependent on the specific application in which the barrier sealant is to be used. A suitable photoinitiator is one that exhibits a light absorption spectrum that is distinct from that of the resins, fillers, and other additives in the radiation curable system. If the sealant must be cured through a cover or substrate, the photoinitiator will be one capable of absorbing radiation at wavelengths for which the cover or substrate is transparent. For example, if a barrier sealant is to be cured through a sodalime glass coverplate, the photoinitiator must have significant UV absorbance above ca. 320 nm. UV radiation below 320 nm will be absorbed by the sodalime glass coverplate and not reach the photoinitiator. In this example, it would be beneficial to include a photosensitizer with the photoinitiator Into the photoinitiating system, to augment the transfer of energy to the photoinitiator.

Exemplary cationic photoinitiators are disclosed in *Ionic Polymerizations and Related processes,* 45-60, 1999, Kluwer Academic Publishers; Netherlands; J. E. Puskas et al. (eds.). Preferred cationic photoinitiators include diaryliodonium salts and triarylsulfonium salts. Well known commercially available examples include UV9380C (GE Silicones), PC2506 (Polyset), SR1012 (Sartomer), Rhodorsil 2074 (Rhodia), and UVI-6974 (Dow). Preferred sensitizers for diaryliodonium salts are isopropylthioxanthone (referred to herein as ITX, often sold as a mixture of 2- and 4-isomers) and 2-chloro-4-propoxythioxanthone. The selection of an efficient cationic photoinitiating system for a particular curing geometry and resin system is known to those skilled in the art of cationic UV curing, and is not limited within the scope of this invention.

Thermal initiating systems, such as thermally generated acids are also suitable for use where such catalysts, initiators, and curing agents are appropriate. Exemplary catalysts include Brønsted acids, Lewis acids, and latent thermal acid generators. Representative examples of Brønsted and Lewis acids may be found in literature sources such as Smith, M. B. and March, J. In *March's Advanced Organic Chemistry, Reactions, Mechanisms, and Structures,* 5$^{th}$ Edition, 2001, John Wiley & Sons, Inc., New York, N.Y. pp. 327-362. Examples of latent thermal acid generators include, but not limited to, diaryliodonium salts, benzylsulfonium salts, phenacylsulfonium salts, N-benzylpyridinium salts, N-benzylpyrazinium salts, N-benzylammonium salts, phosphonium salts, hydrazinium salts, ammonium borate salts, etc.

When a radically polymerizable functionality is present in the meta-substituted aromatic structure, one may use a radical photoinitiator to trigger the radical polymerization. Exemplary radical photoinitiators are disclosed in *Radiation Curing: Science and Technology,* 1992, Plenum Press; New York; S. P. Pappas, Ed. and *Encyclopedia of Polymer Science and Engineering,* 11, 187, 1988, John Wiley and Sons, New York; H. F. Mark, N. M. Bikales, C. G. Overberger, G. Menges, Eds. One may also select a radical thermal initiator for curing purposes and the exemplary thermal initiators are disclosed in *Principles of Polymerization,* 211, 1991, John Wiley and Sons, New York; G. G. Odian, Ed. The selection of an efficient radical Initiating system is known to those skilled in the art of radical curing, and is not limited within the scope of this invention.

Common fillers include, but are not limited to ground quartz, fused silica, amorphous silica, talc, glass beads, graphite, carbon black, alumina, clays, mica, vermiculite, aluminum nitride, and boron nitride. Metal powders and flakes consisting of silver, copper, gold, tin, tin/lead alloys, and other alloys are contemplated. Organic filler powders such as poly(tetrachloroethylene), poly(chlorotrifluoroethylene), and poly(vinylidene chloride) may also be used. Fillers that act as desiccants or oxygen scavengers, including but not limited to, CaO, BaO, $Na_2SO_4$, $CaSO_4$, $MgSO_4$, zeolites, silica gel, $P_2O_5$, $CaCl_2$, and $Al_2O_3$ may also be utilized.

EXAMPLES

Example 1

Syntheses of Aromatic Epoxies

Synthesis of 4,4'-(hexafluoroisoproylidene)diphenol Diglycidyl Ether (BPADGE-$CF_3$):

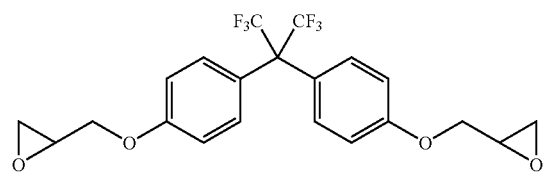

Into a 500 mL three-neck round bottom flask equipped with a reflux condenser, and a mechanical stirrer were added 68.8 g of epichlorohydrin (0.74 mol), 25.0 g of 4,4'-(hexafluoroisoproylidene)diphenol (0.074 mol), and 100 g of isopropyl alcohol. The contents were raised to 75° C. and a slow addition funnel was used to add 26 g of 46% sodium hydroxide in deionized water dropwise over the course of 6 hours. At the end of the slow addition the reaction contents were raised to 83° C. and held at that temperature for another 2 hours. The product was filtered and the solvent was removed. A total of 30.0 g of the crude product was redissolved in toluene and then passed through a 9.0 cm column of silica gel. The solvent was removed and 20.0 g of product was recovered. Yield 60%. $^1$H NMR ($CDCl_3$): δppm 2.76 (2H), 2.91 (2H), 3.35 (2H), 3.97 (2H), 4.25 (2H), 6.90 (4H), 7.30 (4H).

Synthesis of 4,6-dichlororesorcinol Diglycidyl Ether (DCRDGE):

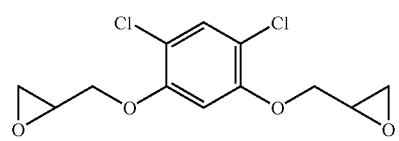

4,6-Dichlororesorcinol (25 g, 0.14 mol), epichlorohydrin (129 g, 1.4 mol) and isopropyl alcohol (100 ml) were added to a three-neck round bottom flask equipped with a reflux condenser and a mechanic stirrer. A solution of sodium hydroxide (12 g) in water (14 g) was placed in an addition funnel. The flask contents were raised to 75° C. The sodium hydroxide solution was added over 6 hours while the reaction was held at 75° C. After the slow addition the reaction was held at 83° C. for an additional 2 hours. The material was filtered and the solvent was removed. The product was then redissolved in toluene and washed with deionized water. The product in toluene was collected after one wash and passed through a silica gel column. The product was collected by removal of the solvent. Yield 50%, mp 78° C., $^1$H NMR ($CDCl_3$): δppm 2.7-2.9 (4H), 3.3 (2H), 3.9-4.3 (4H), 6.7-7.3 (2H).

Synthesis of 4-bromoresorcinol diglycidyl ether (BRDGE):

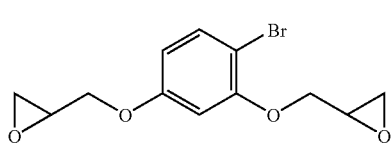

Epichlorohydrin (122.4 g, 1.32 mol), 4-bromoresorcinol (25.0 g, 0.13 mol) and Isopropyl alcohol (100 g) were added to a 500 ml three-neck flask and warmed to 75° C. A solution of 22.2 g 50 wt % sodium hydroxide in water was added dropwise to the flask over 6 hours. The flask temperature was raised to 83° C. and held for an additional 2 hours. After the reaction, the solution was filtered and solvents were evaporated. Toluene was then added to the residual mass. The solids were filtered and the toluene was again removed, giving a light-brown oil. Further purification was conducted using vacuum distillation to give a clear liquid which crystallizes upon standing. $^1$H NMR (CDCl$_3$): δppm 2.6-2.9 (4H), 3.3 (2H), 3.8-4.3 (4H), 6.3-7.4 (3H).

Synthesis of hydroquinone diglycidyl ether (HDGE):

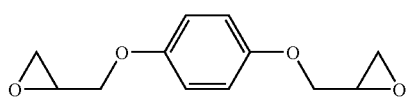

Epichlorohydrin (222 g, 2.4 mol), isopropyl alcohol (120 mL), and hydroquinone (33 g, 0.3 mol) were added to a four-neck 1 L round bottom flask equipped with a condenser, mechanical stirrer, nitrogen source, and an addition funnel containing 28.8 g NaOH in 40 g water. While purging with nitrogen, NaOH solution was added dropwise and the reaction was then heated to 75-83° C. The solution color changed from dark brown to yellow with white solid precipitate after 6 hours. The solution was filtered and the solvents removed to give a viscous yellow liquid, which solidified on cooling and was collected. The product was recrystallized in isopropyl alcohol twice, then distilled under vacuum to give a white solid upon cooling. $^1$H NMR (CDCl$_3$): δppm 2.7-2.9 (4H), 3.3-3.4 (2H), 3.9-4.2 (4H), 6.9 (4H).

Example 2

Comparison of Moisture Permeation Performance of Various Epoxies

Several classes of cationic epoxies were UV cured and the results are compiled in Table 1. Each resin was mixed with 2% UV9380C (GE Silicones) cationic photoinitiator, coated on a Teflon® plate to make a 2-5 mil thin film with a eight-path variable scraper, cured with 6J UVA under a Dymax stationary UV curing unit, followed by annealing at 175° C. for one hour. Moisture permeation coefficient of the films were measured with Mocon Permeatran 3/33 at 50° C., 100% relative humidity. The normalized moisture permeation data is shown in Table 1.

The identified compounds have the following structures:

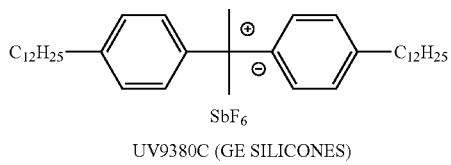

UV9380C (GE SILICONES)

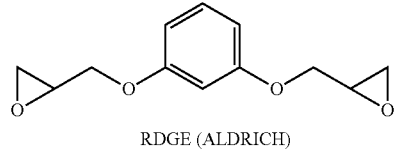

RDGE (ALDRICH)

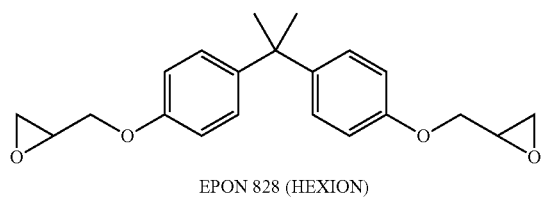

EPON 828 (HEXION)

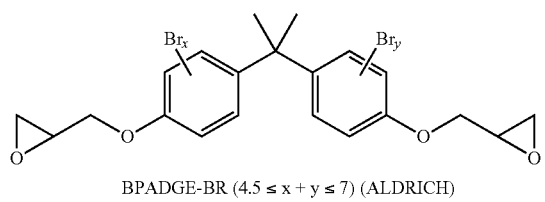

BPADGE-BR (4.5 ≤ x + y ≤ 7) (ALDRICH)

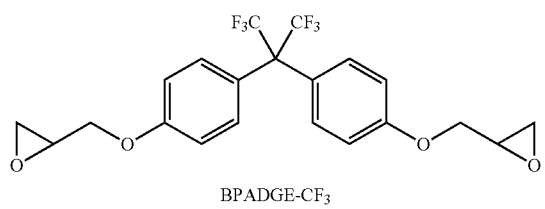

BPADGE-CF$_3$

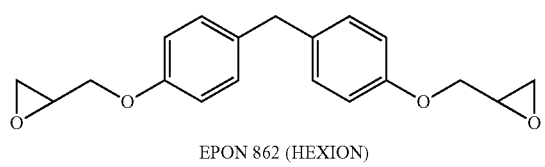

EPON 862 (HEXION)

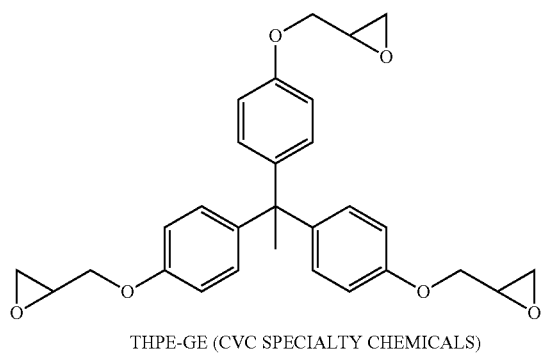

THPE-GE (CVC SPECIALTY CHEMICALS)

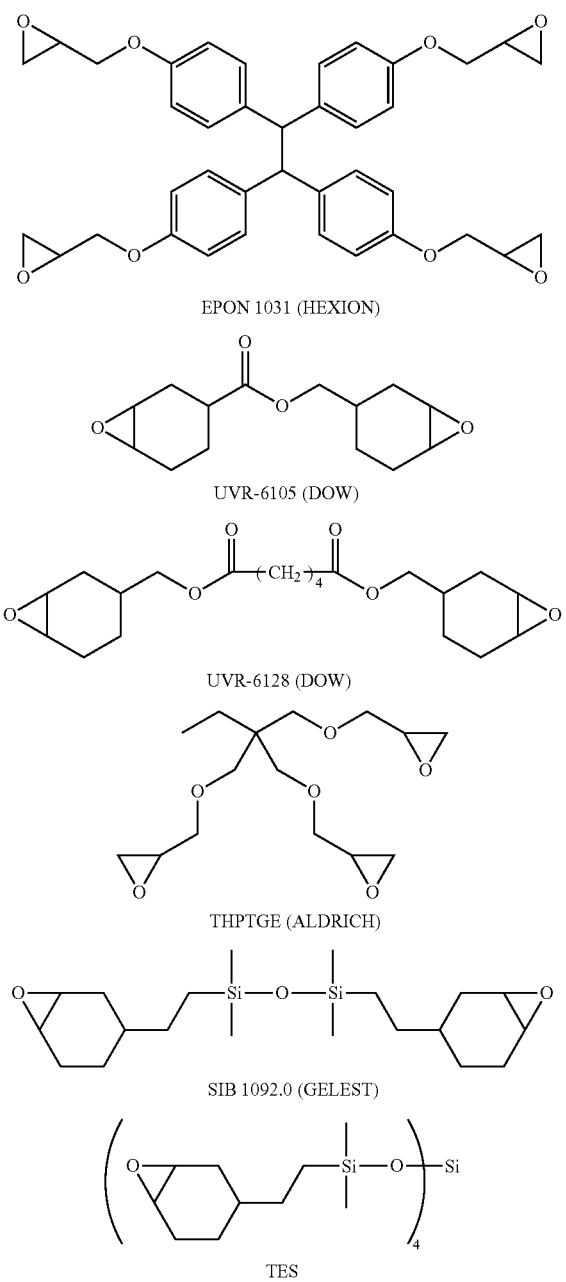

EPON 1031 (HEXION)

UVR-6105 (DOW)

UVR-6128 (DOW)

THPTGE (ALDRICH)

SIB 1092.0 (GELEST)

TES

TABLE 1

MOISTURE PERMEATION PERFORMANCE OF VARIOUS EPOXIES

| RESIN CLASS | FUNCTIONALITY GROUPS | RESIN | PERMEATION g · mil/(100 in² · day) |
|---|---|---|---|
| Aromatic Epoxies | Difunctional | RDGE | 6.2 |
| | | EPON 862 | 7.5 |
| | | BPADGE-BR | 5.3 |
| | | BPADGE-CF$_3$ | 8.4 |
| | | EPON 828 | 9.9 |
| | Trifunctional | THPE-GE | 18.3 |
| | Tetrafunctional | EPON 1031 | 23.0 |

TABLE 1-continued

MOISTURE PERMEATION PERFORMANCE OF VARIOUS EPOXIES

| RESIN CLASS | FUNCTIONALITY GROUPS | RESIN | PERMEATION g · mil/(100 in² · day) |
|---|---|---|---|
| Aliphatic Epoxies | Difunctional | UVR-6105 | 26.3 |
| | | UVR-6128 | 28.4 |
| | Trifunctional | TMPTGE | 18.2 |
| Siloxane Epoxies | Difunctional | SIB1092.0 | 18.8 |
| | Tetrafunctional | TES | 23.9 |

As the comparison shows, resorcinol diglycidyl ether (RDGE, Aldrich) gives one of the lowest moisture permeation. It also reveals that halogenated epoxies are generally better than their regular hydrocarbon analogues, as seen In the comparison of EPON 828 versus BPADGE-BR and BPADGE-CF$_3$. Although cured BPADGE-BR film has even lower permeation than RDGE, this sample is a solid and requires heating above 100° C. to make a film.

The comparison of difunctional versus tri- and tetra-functional aromatic epoxies shows that adding functionality does not necessarily help permeability performance. Many of these aromatic epoxies have similar epoxy equivalent weight, yet we observed higher permeability when the functionality increased. Both THPE-GE and EPON 1031 required heating above 100° C. to cast a film for curing.

Several commonly used aliphatic epoxies and siloxane epoxies have also been tested and the results show that they do not possess as low permeability performance as the aromatic ones, even though their epoxy equivalent weight is similar or lower than the aromatic ones. Further, these comparisons demonstrate that permeability is affected by both the diffusivity and solubility, not solubility alone, and one cannot achieve low permeability by simply building hydrophobic structures such as siloxane epoxies. The tetra-functional TES epoxy siloxane (lab sample, National Starch & Chemical Company) again gave higher permeation than the difunctional SIB1092.0 sample.

Example 3

Comparison of RDGE with Various Analogues

A formulation of 50/50 blend of DCRDGE/EPON 862 with 2% UV9380C photoinitiator was prepared. The DCRDGE/EPON 862 blend was solid at room temperature but melted at higher temperatures. Film preparation required preheating the resin before it was cast and then curing with 4J UVA and 175° C./1 hr thermal annealing. The permeation found for this blend was 4.9 g·mil/(100 in²·day), which was significantly lower than the EPON 862 alone, or a 50/50 EPON/RDGE blend which gives permeation of 6.3 g·mil/(100 in²·day).

In another embodiment, a 50/50 blend of BRDGE/Aron Oxetane OXT-121 (Toagosei) gave a permeation value of 7.3 g·mil/(100 in²·day) when cured with 3J UVA using 2 wt % SR1012 as the photoinitiator. In comparison, a 50/50 blend of RDGE/OXT-121 gave permeation value of 9.5 g·mil/(100 in²·day) under the same condition. These experiments again demonstrate the benefit of halogenation. OXT-121 and SR1012 have the following structures:

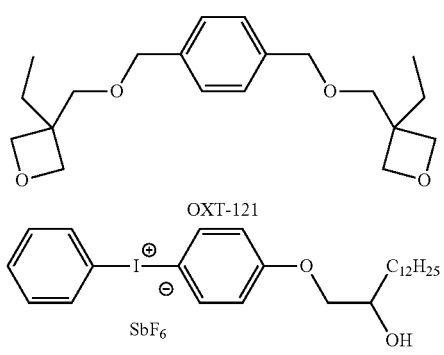

OXT-121

SR1012

Example 4

Effect of Aromatic Substitution on Permeation Coefficient

The impact of various resin backbone structures on the permeability of the cured formulations is further demonstrated in a talc-filled formulation. Several blends containing 32.5 parts EPON 862, 32.5 parts of a resin additive, 35 parts of talc were prepared and cured. Each formulation contained 2 wt % SR1012 and 0.21 wt % ITX based on the resins and was cured with 3J UVA followed by 70° C./10 min thermal annealing. The results are summarized in Table 2. The effect of the aromatic backbone and meta substitution is shown in the comparisons.

TABLE 2

MOISTURE PERMEATION PERFORMANCE OF VARIOUS FILLED EPOXY BLENDS

| RESIN ADDITIVE | PERMEATION g · mil/ (100 in² · day) |
|---|---|
| 1,4-cyclohexanedimethanol diglycidyl ether (CHDGE) | 7.3 |
| 1,4-benzenedimethanol diglycidyl ether (BDGE) is a National Starch and Chemical lab sample | 6.1 |
|  | Not miscible |
|  | 2.7 |

ITX (Albemarle) is a cationic photosensitizer having the following structure:

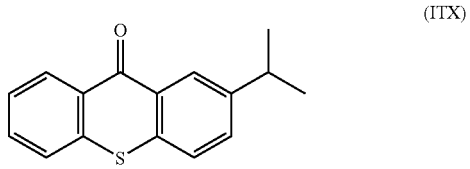

(ITX)

In addition to epoxy additives, blends of EPON 862 with several vinyl ether compounds were also prepared and cured. These blends contained 88 parts EPON 862, 10 parts vinyl ether, 2 parts UV 9380C, and were cured with 3J UVA without post thermal annealing. The results are summarized in Table 3.

TABLE 3

MOISTURE PERMEATION OF VARIOUS EPOXY/VINYL ETHER BLENDS

| VINYL ETHER ADDITIVE | PERMEATION g · mil/(100 in² · day) |
|---|---|
| None | 7.5 |
| VEctomer ® 5015 vinyl ether | 9.0 |
| VEctomer ® 4010 vinyl ether | 7.9 |
| VEctomer ® 4060 vinyl ether | 11.3 |
| VEctomer ® 4051 vinyl ether | not miscible |

VEctomer ® 5015 vinyl ether (Morflex) is tris[4-(vinyloxy)butyl] trimellitate having the following structure:

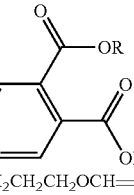

R = —CH$_2$CH$_2$CH$_2$CH$_2$OCH=CH$_2$

VEctomer ® 4010 vinyl ether (Morflex) is bis[4-(vinyloxy)butyl] isophthalate having the following structure:

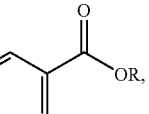

R = —CH$_2$CH$_2$CH$_2$CH$_2$OCH=CH$_2$

VEctomer ® 4060 vinyl ether (Morflex) is bis[4-(vinyloxy)butyl] adipate having the following structure:

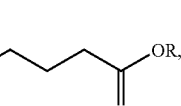

R = —CH$_2$CH$_2$CH$_2$CH$_2$OCH=CH$_2$

VEctomer ® 4051 vinyl ether (Morflex) is bis[[(4-[(vinyloxy)methyl] cyclohexyl]methyl] terephthalate having the following structure:

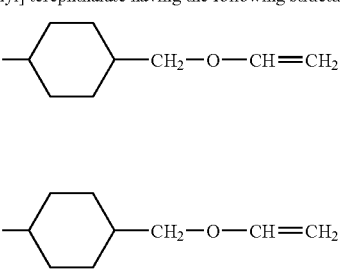

These results again show that aromatic substitution generally gives lower moisture permeation than aliphatic ones. More importantly, they also show that meta-substitution alone does not guarantee better barrier performance, such as the cases of VEctomer® 5015, VEctomer® 4010. Even at relatively low loading percentage, samples containing these materials both showed increase in moisture permeation. However, these vinyl ether additives may still be used where faster curing speed is desired.

Example 5

RDGE-Based Barrier Sealant 1

RDGE/EPON 862 mixture, a photoinitiating system (cationic photoinitiator and ITX), and a silane adhesion promoter were placed in a plastic jar and mixed with a vortex mixer for one hour until clear. Micron sized silica was then added to the jar and the whole sample was mixed for another hour with the vortex mixer. The resulting paste was further mixed with a ceramic three-roll mill and degassed in a vacuum chamber. The components and parts by weight are disclosed in Table 4. The viscosity (25° C.) of this formulation is 15,600 cP at 10 rpm and 32,000 cP at 1 rpm using a Brookfield DV-II+ cone and plate viscometer and a CP-51 plate.

TABLE 4

BARRIER SEALANT #1

| COMPONENT | PARTS BY WEIGHT |
|---|---|
| RDGE | 16.45 |
| EPON 862 | 16.45 |
| SR1012 | 0.67 |
| ITX | 0.24 |
| Silane Adhesion Promoter | 1.14 |
| Micron sized silica | 65.05 |
| Total: | 100 |

To measure moisture permeation, 1-2 grams of formulation material were placed on a TEFLON coated aluminum plate. An eight-path variable scraper was used to cast an even thickness of film. The sample was then placed inside a Dymax stationary curing unit and cured for 70 seconds (3.3 J/cm² UVA) with a medium pressure mercury lamp. Irradiance on the sample surface was measured with a UV Power Puck high energy UV radiometer (EIT Inc., Sterling, Va.) and was found to be 47 (UVA), 32 (UVB), 3 (UVC), 35 (UVV) mW/cm² respectively. Moisture permeation coefficient (50° C., 100% relative humidity) of the above film was measured with Mocon Permeatran 3/33 and was found to be 3.0 g·mil/100 in²·day.

Adhesion performance was tested by applying two pieces of tape (~5 mils) approximately a quarter of an inch apart on TEFLON coated aluminum plates. Using a blade, the formulation was drawn into a film between the tapes. A piece of glass slide and several 4×4 mm glass dies were wiped clean with isopropanol and sonicated for ten minutes in isopropanol. The slides and dies were removed from the isopropanol and air-dried followed by 5 min UV ozone cleaning. The dies were then placed in the film of formulation and slightly tapped to wet out the entire die. The dies were picked from the formulation coating and placed onto the slides. The dies were slightly tapped to allow the formulation to wet out between the die and the slide. The sealant formulations were cured in a Dymax UV curing unit with 3.3 J/cm² UVA. The shear adhesion of the cured samples was tested using a Royce Instrument 552 100K equipped with a 100 kg head and a 300 mil die tool. The adhesion was found to be 39.3±10.2 kg.

Example 6

RDGE-Based Barrier Sealant #2

Barrier sealant #2 containing a polycyclic epoxy was prepared similarly to barrier sealant #1, and the components are listed in Table 5.

TABLE 5

BARRIER SEALANT #2

| COMPONENT | PARTS BY WEIGHT |
|---|---|
| RDGE | 11.27 |
| EPON 862 | 11.27 |
| Epiclon HP-7200 | 9.66 |
| SR1012 | 0.65 |
| ITX | 0.23 |
| Silane Adhesion Promoter | 1.19 |
| Micron sized silica | 65.15 |
| Nanosilica rheology modifier | 0.59 |
| Total: | 100 |

Epiclon HP-7200 (DAINIPPON INK & CHEMICALS) has the structure:

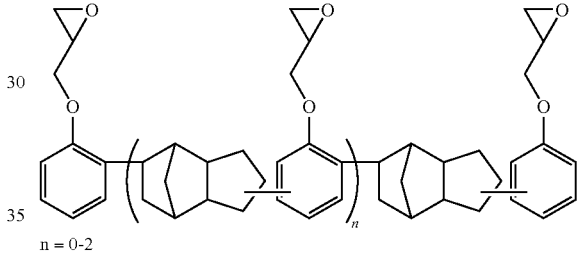

n = 0-2

Moisture permeation coefficient (50° C., 100% relative humidity) of the above sample after 6J UVA was measured with Mocon Permeatran 3/33 and was found to be 2.6 g·mil/100 in²·day. The adhesion was found to be 22.5±4.4 kg using the method described in Example 5. There was no change in adhesion after aging at 65° C./80% relative humidity for two weeks.

What is claimed:

1. A cationically curable barrier composition consisting essentially of:
   (a) a meta-substituted aromatic epoxy compound having the general structure:

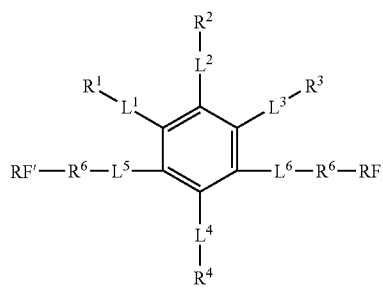

in which
   $R^1$, $R^2$, $R^3$, $R^4$ are selected from the group consisting hydrogen, halogen, cyano, alkyl, aryl, and substituted alkyl or aryl groups;

$R^5$, $R^6$ are divalent hydrocarbon linkers having the general structure —$C_nH_{2n}$—, where n=0-4;

$L^1, L^2, L^3, L^4, L^5, L^6$ are either a direct bond or a divalent linking group selected from

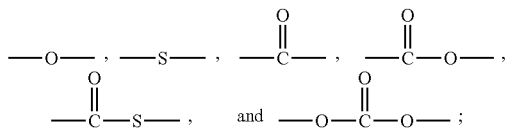

EP is an epoxy group selected from the group consisting of aliphatic epoxy, glycidyl ether, and cycloaliphatic epoxy, in which the hydrogens on any of the epoxy groups is optionally substituted by one or more alkyl or halogen groups;

RF is a reactive functionality selected from the groups consisting of EP, an hydroxyl (—OH), a vinyl ether (—O—CH=$CH_2$), a propenyl ether (—O—CH=CH—$CH_3$), a crotyl ether (—O—CH=CH—$C_2H_5$), a styrenic, an acrylate, a methacrylate, an itaconate, a maleimide, a maleate, a fumarate, a cinnamate, an acrylamide, a methacrylamide, a chalcone, a thiol, an allyl, an alkenyl, and a cycloalkenyl; and (b) a cationic inititiator, and (c) one or more epoxy resins selected from the group consisting of bisphenol F diglycidyl ether, novolac glycidyl ethers, polycyclic epoxies, and halogenated glycidyl ethers.

2. The curable barrier composition according to claim 1 in which the EP epoxy group is selected from the group consisting of

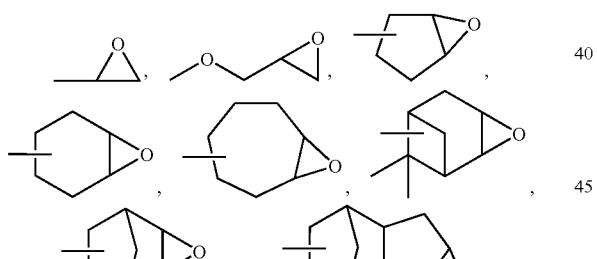

in which the hydrogens on the EP structure may be substituted by one or more alkyl or halogen groups.

3. The curable barrier composition according to claim 1, in which the aromatic compound (a) is selected from the group consisting of:

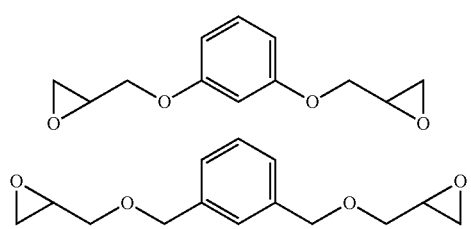

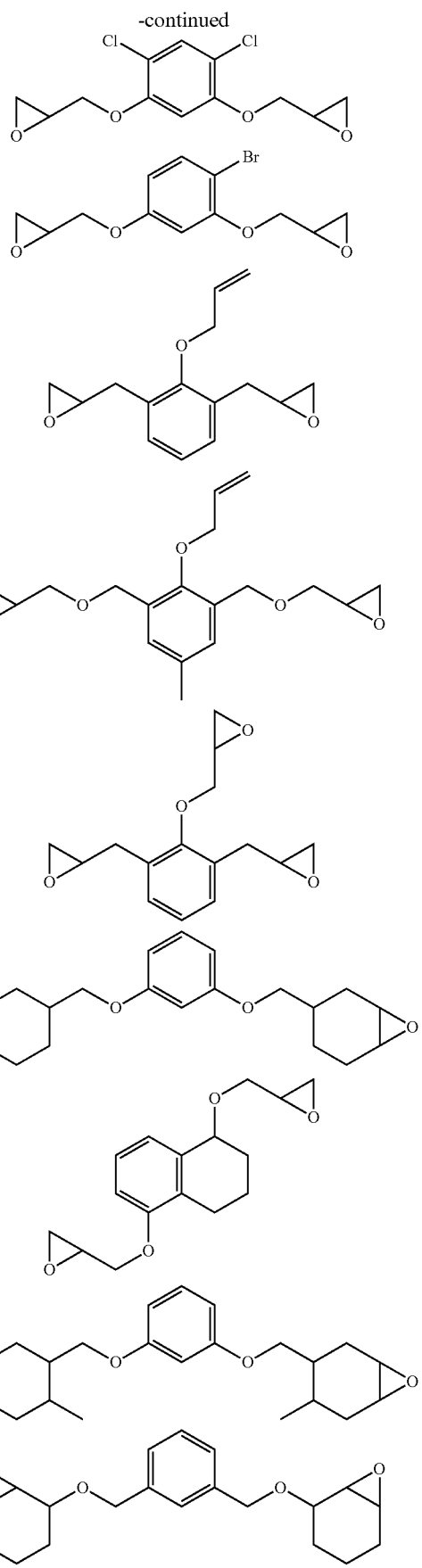

-continued

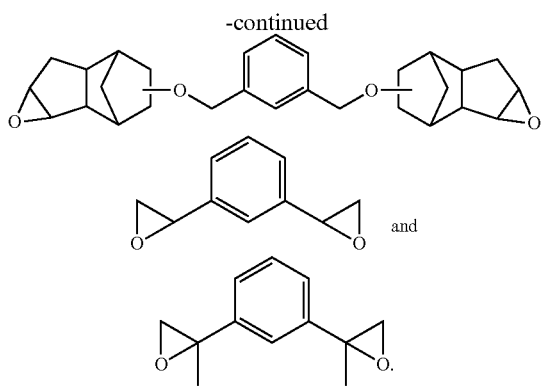

and

4. The curable barrier composition according to claim 1 in which the initiator is a cationic initiator selected from the group consisting of a cationic photoinitiator, a Brønsted acid, a Lewis acid, and a photo- or thermal-acid generator.

5. The cationically curable barrier composition according to claim 1 in which one or more fillers are present.

6. The curable barrier composition according to claim 5 in which one or more fillers are present and are selected from the group consisting of ground quartz, fused silica, amorphous silica, talc, glass beads, graphite, carbon black, alumina, clays, mica, vermiculite, aluminum nitride, boron nitride; silver, copper, gold, tin, tin/lead alloys, poly(tetrachloroethylene), poly(chlorotriflouroethylene), poly(vinylidene chloride), CaO, BaO, $Na_2SO_4$, $CaSO_4$, $MgSO_4$, zeolites, silica gel, $P_2O_5$, $CaCl_2$, and $Al_2O_3$.

7. The curable barrier composition according to claim 1 in which one or more adhesion promoters are present.

8. The curable barrier composition according to claim 7 in which the one or more adhesion promoters are one or more silanes.

9. An electronic or optoelectronic device sealed, coated, or encapsulated with the curable barrier sealant according to claim 1.

10. The electronic or optoelectronic device according to claim 9 in which the device is an organic light emitting diode.

* * * * *